United States Patent
Farnworth

[11] Patent Number: 5,739,050
[45] Date of Patent: Apr. 14, 1998

[54] METHOD AND APPARATUS FOR ASSEMBLING A SEMICONDUCTOR PACKAGE FOR TESTING

[75] Inventor: Warren M. Farnworth, Nampa, Id.

[73] Assignee: Micron Technology, Inc., Boise, Id.

[21] Appl. No.: 592,204

[22] Filed: Jan. 26, 1996

[51] Int. Cl.$^6$ ................................ H01R 43/00
[52] U.S. Cl. ................................ 438/15; 438/14
[58] Field of Search ................... 438/14, 15, 17

[56] References Cited

U.S. PATENT DOCUMENTS

| | | | |
|---|---|---|---|
| 4,899,921 | 2/1990 | Bendat et al. | 228/105 |
| 5,006,792 | 4/1991 | Malhi et al. | 324/158 F |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,159,266 | 10/1992 | Appolo | 438/15 |
| 5,307,891 | 5/1994 | Wood et al. | 324/158 |
| 5,367,253 | 11/1994 | Wood et al. | 324/158.1 |
| 5,397,245 | 3/1995 | Roebuck et al. | 439/264 |
| 5,406,699 | 4/1995 | Oyama | 438/15 |
| 5,408,190 | 4/1995 | Wood et al. | 324/765 |
| 5,419,807 | 5/1995 | Akram et al. | 156/647.1 |
| 5,451,165 | 9/1995 | Cearley-Cabbiness et al. | 439/71 |
| 5,456,404 | 10/1995 | Robinette, Jr. et al. | 228/104 |
| 5,519,332 | 5/1996 | Wood et al. | 324/755 |
| 5,541,525 | 7/1996 | Wood et al. | 324/755 |
| 5,548,884 | 8/1996 | Kim | 438/15 |
| 5,578,934 | 11/1996 | Wood et al. | 324/758 |
| 5,634,267 | 6/1997 | Farnworth et al. | 29/840 |

OTHER PUBLICATIONS

Cloud et al., Equipment, Processes and Methods for High Volume KGD Production, Third Annual Manufacturing Test Conference, Semicon West. 1996.

Primary Examiner—Kevin Picardat
Attorney, Agent, or Firm—Stephen A. Gratton

[57] ABSTRACT

A method and apparatus for assembling a temporary package for a semiconductor die are provided. The temporary package includes a package base, an interconnect for establishing electrical communication with the die, and a force applying mechanism for biasing the die against the interconnect. The method includes the steps of: supporting the package base; aligning the die with the interconnect held in the package base; placing the die and interconnect in contact; and then attaching the force applying mechanism to the base while it is allowed to slide along a plane parallel to the base to compensate for misalignment. The apparatus includes a movable support for the package base; an optical probe for aligning the die and interconnect; a vacuum conduit for placing the die in contact with the interconnect; and a slide holder for attaching the force applying mechanism to the base.

26 Claims, 5 Drawing Sheets

PROVIDING A TEMPORARY PACKAGE FOR A SEMICONDUCTOR DIE INCLUDING A PACKAGE BASE, AN INTERCONNECT AND A FORCE APPLYING MECHANISM

PROVIDING AN ASSEMBLY TOOL FOR ASSEMBLING THE DIE AND THE FORCE APPLYING MECHANISM ON THE PACKAGE BASE

ATTACHING THE DIE AND THE FORCE APPLYING MECHANISM TO THE ASSEMBLY TOOL

ALIGNING THE DIE WITH THE INTERCONNECT

PLACING THE DIE IN CONTACT WITH THE INTERCONNECT

ATTACHING THE FORCE APPLYING MECHANISM TO THE PACKAGE BASE WHILE ALLOWING THE FORCE APPLYING MECHANISM TO SLIDE ALONG A PLANE TO COMPENSATE FOR MISALIGNMENT WITH THE PACKAGE BASE

METHOD AND APPARATUS FOR ASSEMBLING A SEMICONDUCTOR PACKAGE FOR TESTING

FIELD OF THE INVENTION

This invention relates to semiconductor manufacture and more particularly to an improved method and apparatus for assembling an unpackaged semiconductor die into a temporary package for testing.

BACKGROUND OF THE INVENTION

Unpackaged or bare semiconductor dice are used to construct multi chip modules and other electronic devices. Unpackaged dice must be tested and burned in during the manufacturing process to certify each die as a known good die. This has led to the development of temporary packages that hold a single bare die for testing and also provide the electrical interconnection between the bond pads on the die and external test circuitry. Exemplary temporary packages are disclosed in U.S. Pat. No. 5,302,891 to Wood et al. and U.S. Pat. No. 5,408,190 to Wood et al.

Typically, this type of temporary package includes an interconnect having contact members that contact and establish a temporary electrical connection with the bond pads on the die. The temporary package can also include a force applying mechanism that presses the die against the interconnect. For example, the force applying mechanism can include a bridge clamp that attaches to a package base, and a leaf spring that presses the die against the interconnect.

During assembly of the temporary package, it is necessary to align the bond pads on the die, with the contact members on the interconnect, and then to attach the force applying mechanism to the package base. One method for aligning the die and interconnect uses an assembly tool similar to aligner bonders used for flip chip bonding bumped semiconductor dice to a circuit board.

The assembly tool can include a vacuum conduit for the die and a holder for the force applying mechanism. In addition, the assembly tool can include an adjustable support member that holds and moves the package base during the alignment procedure, and an optical probe that simultaneously views the die and interconnect. Using input from the optical probe, the vacuum conduit and support member can be moved to position the interconnect in alignment with the die. The vacuum conduit then moves the die into contact with the interconnect and the holder attaches the force applying mechanism to the base.

One problem that occurs with this type of assembly tool is that although the die and interconnect may be aligned, the force applying mechanism and package base may be misaligned. This misalignment can place a shear load between the die and interconnect and cause these components to become misaligned as the force applying mechanism is attached to the package base. This same situation can occur during disassembly of the package. The present invention is directed to a method and apparatus for maintaining alignment of the die and interconnect during assembly and disassembly of a temporary package, even if the force applying mechanism and the package base are misaligned.

Accordingly, it is an object of the present invention to provide an improved method and apparatus for assembling and disassembling a temporary package for a bare semiconductor die. It is another object of the present invention to provide an improved apparatus for assembling temporary packages for semiconductor dice that includes an assembly tool adapted to float to compensate for misalignment between the force applying mechanism for the package and the package base. Other objects, advantages and capabilities of the present invention will become more apparent as the description proceeds.

SUMMARY OF THE INVENTION

In accordance with the present invention, an improved method and apparatus for assembling and disassembling a temporary package for a bare semiconductor die are provided. The temporary package includes a package base, an interconnect for establishing temporary electrical communication between the die and test circuitry, and a force applying mechanism for biasing the die against the interconnect.

The method, simply stated, comprises the steps of: supporting the package base; aligning the die with the interconnect held in the base; placing the die and interconnect in contact; and then attaching the force applying mechanism to the package base while allowing the force applying mechanism to freely slide to compensate for any misalignment between the force applying mechanism and the base.

The apparatus includes: a support member for the package base; an optical probe for optically aligning the die and interconnect; and an assembly tool adapted to hold the die and the force applying mechanism for assembly and disassembly of the package. The assembly tool includes a vacuum conduit connected to a vacuum source for handling the die. In addition, the assembly tool includes a slide holder that attaches to a bridge clamp of the force applying mechanism and permits the bridge clamp to freely slide in either direction along a plane parallel to the package base. This sliding movement permits the bridge clamp to self center on openings in the package base during attachment and detachment of the bridge clamp from the base. The slide holder also includes compression arms that compress and then release the bridge clamp to allow the bridge clamp to attach to the package base.

During an assembly sequence, the vacuum conduit places the aligned die into contact with the interconnect held in the package base. At the same time, the compression arms of the slide holder compress the bridge clamp as it is placed into openings in the package base. With the bridge clamp placed in the openings on the base, the compression arms release, allowing the bridge clamp under tension from the spring to remain attached to the package base. During tensioning of the bridge clamp, the slidable mounting of the slide holder permits the bridge clamp to slide and self center on the openings to prevent shear loading of the aligned die. The reverse sequence is followed during disassembly of the package. During disassembly, the vacuum conduit attaches to the die and the slide holder removes the bridge clamp while the bridge clamp can again slide to prevent shear loading of the die.

DETAILED DESCRIPTION OF THE PREFERRED EMBODIMENT

Figure 1:
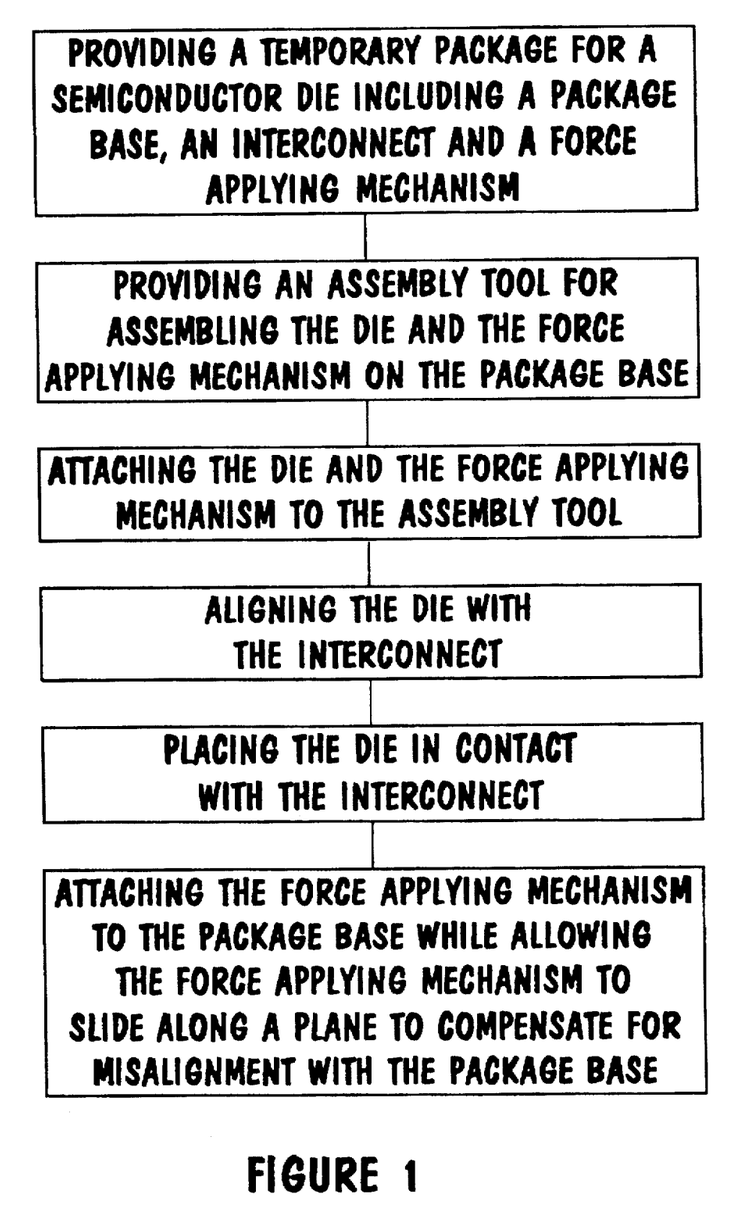
FIG. 1 is a block diagram of steps included in the method of the invention.

Referring to FIG. 1, the steps included in the method of the invention are shown and generally stated include:

A. Providing a temporary package for a semiconductor die including a package base, an interconnect and a force applying mechanism.

B. Providing an assembly tool for assembling the die and the force applying mechanism on the package base.

C. Attaching the die and the force applying mechanism to the assembly tool.

D. Aligning the die with the interconnect.

E. Placing the die in contact with the interconnect.

F. Attaching the force applying mechanism to the package base while allowing the force applying mechanism to slide along a plane parallel to the package base to compensate for misalignment with the package base.

Figure 2:
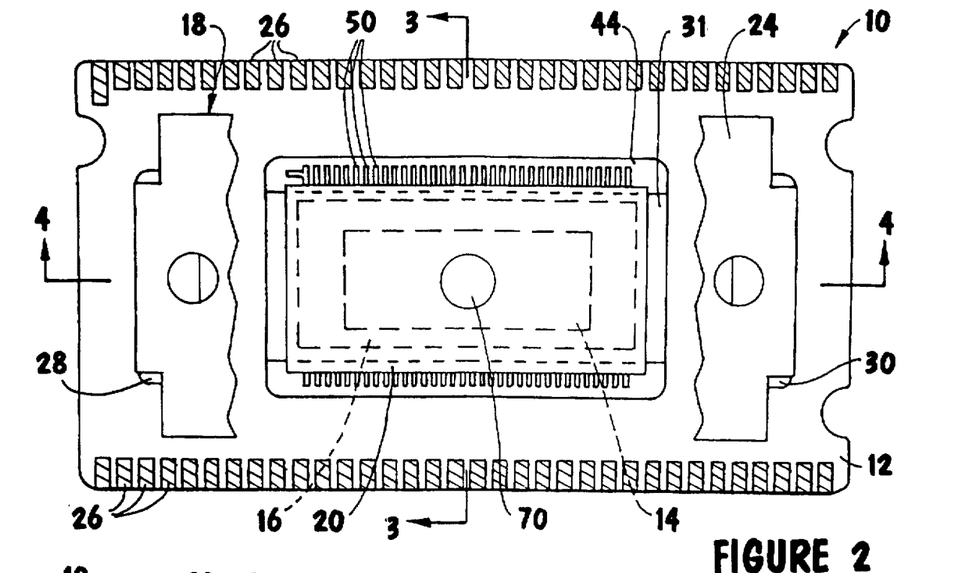
FIG. 2 is a plan view partially cut away of a temporary package suitable for use with the method and apparatus of the invention.
Figure 3:
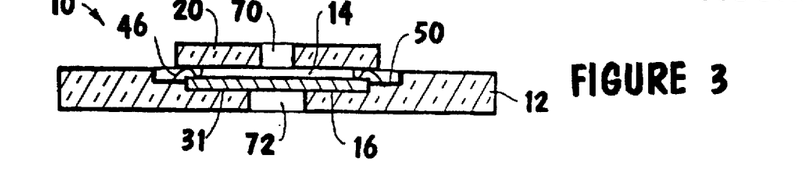
FIG. 3 is a cross sectional view taken along section line 3—3 of FIG. 1.
Figure 4:
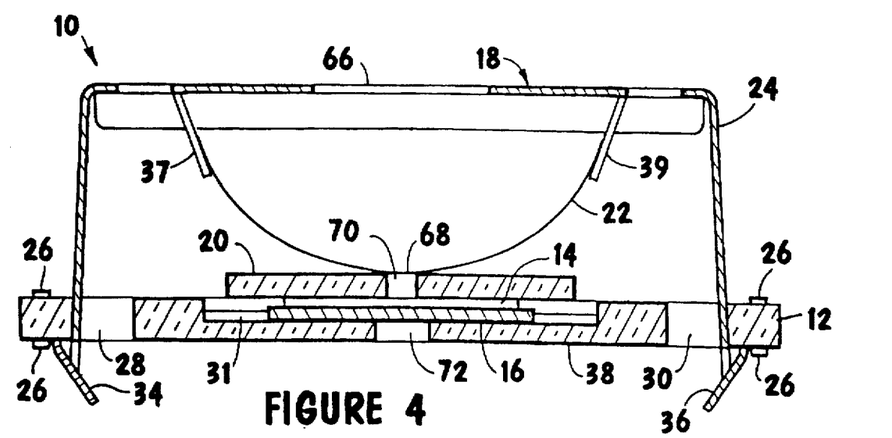
FIG. 4 is a cross sectional view taken along section line 4—4 of FIG. 1.

Referring to FIGS. 2–4, a temporary package 10 suitable for use with the above method is shown. The package 10 includes: a package base 12 adapted to retain a die 14 for testing; an interconnect 16 adapted to establish temporary electrical communication between the die 14 and test circuitry (test circuitry not shown); and a force applying mechanism 18 comprising a pressure plate 20, a spring 22 (FIG. 4) and a bridge clamp 24 (FIG. 4) for pressing the die 14 against the interconnect 16.

In the assembled package 10, the interconnect 16 fits within the package base 12 within a cavity 31. The cavity 31 includes having an extraction opening 72 (FIG. 4) for removing the interconnect 16. The interconnect 16 can be wire bonded to the package base 12 such that an electrical path is provided to external contacts 26 formed on the package base 12. In the assembled package 10, the die 14 is placed face down (i.e., bond pad side down) on the interconnect 16. The die 14 is retained and biased into engagement with the interconnect 16 by the force applying mechanism 18. The assembled package 10 is designed to be placed in a burn-in oven (not shown) or other test fixture for testing the die 14. The burn-in oven typically includes a socket or printed circuit board (PCB) for effecting the electrical connection between the contacts 26 and external test circuitry.

The package base 12 includes a pair of slotted through openings 28, 30 for retaining the bridge clamp 24 of the force applying mechanism 18. As shown in FIG. 4, the bridge clamp 24 is a flexible structure formed of a resilient material such as steel. The bridge clamp 24 includes mounting tabs 34, 36 adapted to fit through the openings 28, 30 in the base 12, and engage the lower surface 38 of the package base 12. The bridge clamp 24 also includes mounting tabs 37, 39 for the spring 22. In the assembled package 10, the structure of the mounting tabs 34, 36 and the bridge clamp 24, under tensioning from the spring 22, cooperate to secure the bridge clamp 24 to the package base 12. This arrangement also functions to secure the die 14 within the package base 12, and to bias the die 14 and interconnect 16 together with a predetermined force.

Figure 6A:
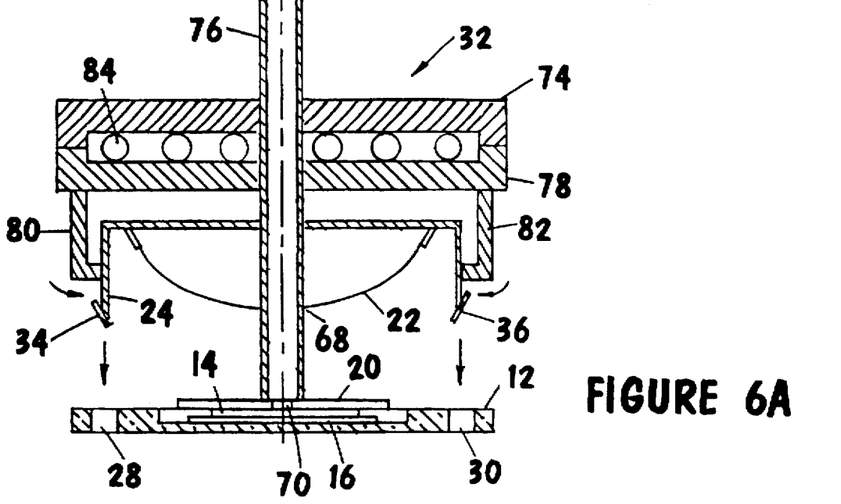
FIG. 6A is a schematic cross sectional view of an assembly tool constructed in accordance with the invention shown with a bridge clamp for the package compressed during assembly of the package.

The bridge clamp 24 is attached to, or detached from, the package base 12 using an assembly tool 32 (FIG. 6A) constructed in accordance with the invention. For assembly of the package 10, the assembly tool 32 is adapted to hold the die 14 and bridge clamp 24 with the sides of the bridge clamp 24 compressed (FIG. 6A). Once the die 14 is placed into contact with the interconnect 16 and the tabs 34, 36 placed through the openings 28, 30, the assembly tool 32 releases the sides of the bridge clamp 24 (FIG. 6B) so that the tabs 34, 36 can engage the lower surface 38 of the package base 12. For disassembly of the package 10, the assembly tool 32 is adapted to attach to the die 14 and bridge clamp 24, and to compress the sides of the bridge clamp 24 while the die 14 and bridge clamp 24 are pulled away from the base 12. The construction and operation of the assembly tool 32 will be more fully explained as the description proceeds.

Figure 5:
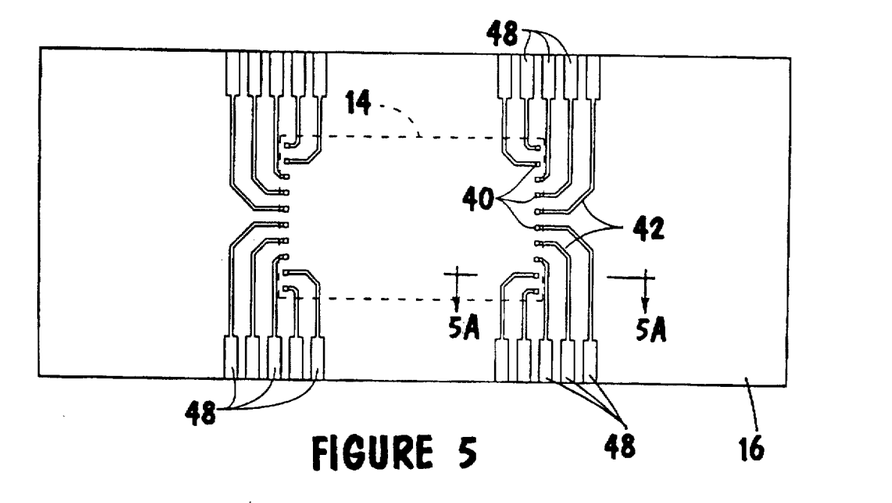
FIG. 5 is a plan view of an interconnect component for the package shown in FIG. 2.
Figure 5A:
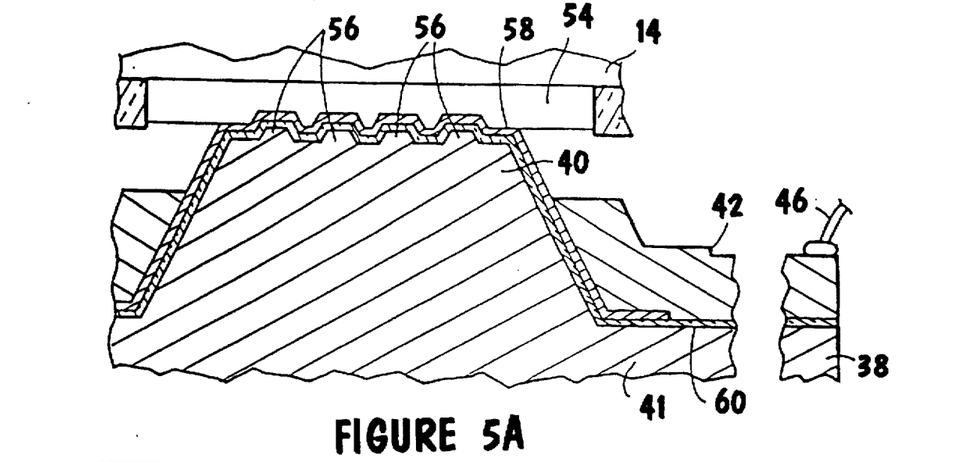
FIG. 5A is a cross sectional view taken along section line 5A—5A of FIG. 5.

Referring to FIGS. 5 and 5A, the interconnect 16 for the package 10 includes a substrate 14 formed of silicon and having raised contact members 40. Each contact member 40 is connected to an electrically conductive trace 42 adapted to conduct electrical signals to and from the contact members 40. Bonding sites 48 are formed at the terminating ends of the conductive traces 42. The bonding sites 50 are wire bonded using wires 46 (FIG. 3) to corresponding bonding sites 50 (FIG. 3) on the package base 12. The bonding sites 50 are formed on a bond shelf 44 (FIG. 2). In addition, the bonding sites 50 on the package base 12 are in electrical communication via internal conductive lines (not shown) to the external contacts 26 (FIG. 2).

The contact members 40 on the interconnect 16 are spaced in a pattern that corresponds to the placement of the bond pads 54 (FIG. 5A) on the die 14. As shown in FIG. 5A, the raised contact members 40 are adapted to contact the bond pads 54 of the die 14 and form an electrical connection therewith. Each contact member 40 includes one or more penetrating projections 56 adapted to penetrate into the bond pads 54 of the die 14 and to pierce the native oxide on the bond pads 54 and form an ohmic contact. At the same time, a top surface of the contact member 40 limits the penetration depth of the penetrating projections 56 into the bond pad 54. The height of the penetrating projections 56 is selected to be less than the thickness of the bond pad 54.

Each contact member 40 includes a conductive layer 58 formed of a metal or metal-silicide layer. The conductive layer 58 for each contact member 40 is connected to a conductive trace 42. The conductive layers 58 and conductive traces 42 are insulated from the silicon substrate 41 by an insulating layer 60 (e.g., $SiO_2$).

Figure 5B:
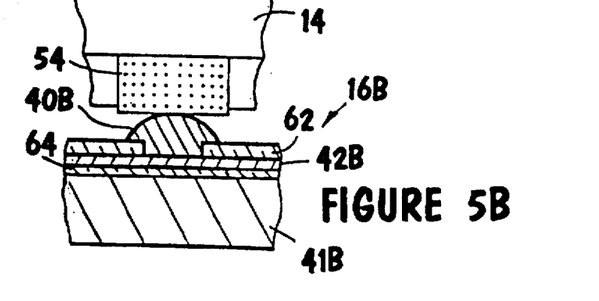
FIG. 5B is a cross sectional view equivalent to FIG. 5A of an alternate embodiment interconnect.

Alternately, as shown in FIG. 5B, an interconnect 16B can be formed with microbump contacts 40B mounted on a flexible tape 62. The tape 62 is similar to two layer TAB tape and also includes conductive traces 42B. The flexible tape 62 is attached to a substrate 41B using a compliant adhesive layer 64.

Further details of the package 10 and interconnect 16 including methods of manufacture are described in U.S. Pat. No. 5,519,332, which is incorporated herein by reference.

Figure 6B:
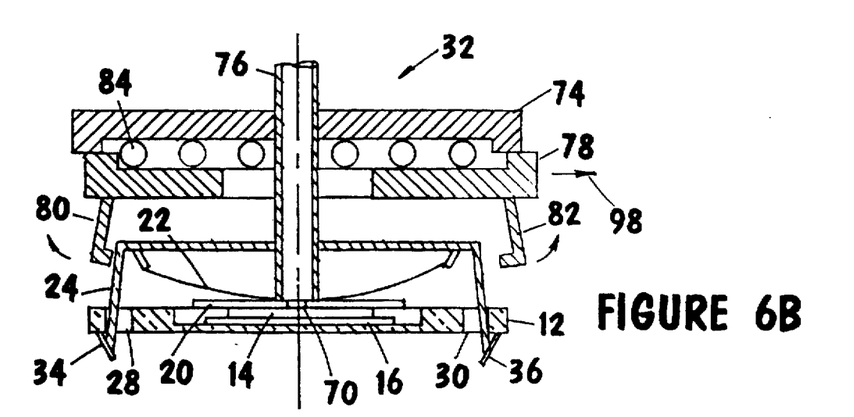
FIG. 6B is a schematic cross sectional view of the assembly tool shown with a slide holder of the tool sliding to compensate for misalignment between the bridge clamp and package base.

Referring to FIGS. 6A and 6B, the assembly tool 32 is shown assembling the package 10. In FIG. 6A, the die 14 has been placed into contact with the interconnect 16 and the bridge clamp 24 is being attached to the package base 12. In FIG. 6B, the bridge clamp 24 has been attached to the package base 12 with the die 14 in contact with the interconnect 16.

As shown in FIGS. 6A and 6B, the assembly tool 32 includes a base member 74, a vacuum conduit 76, and a slide holder 78. The assembly tool 32 is adapted to pick up the die 14, pressure plate 20 and bridge clamp 24 from various locations for assembling the package 10. The package base 12 and interconnect 16 are held separately on a movable support 96 (FIG. 7) of the assembly tool 32.

Figure 7:
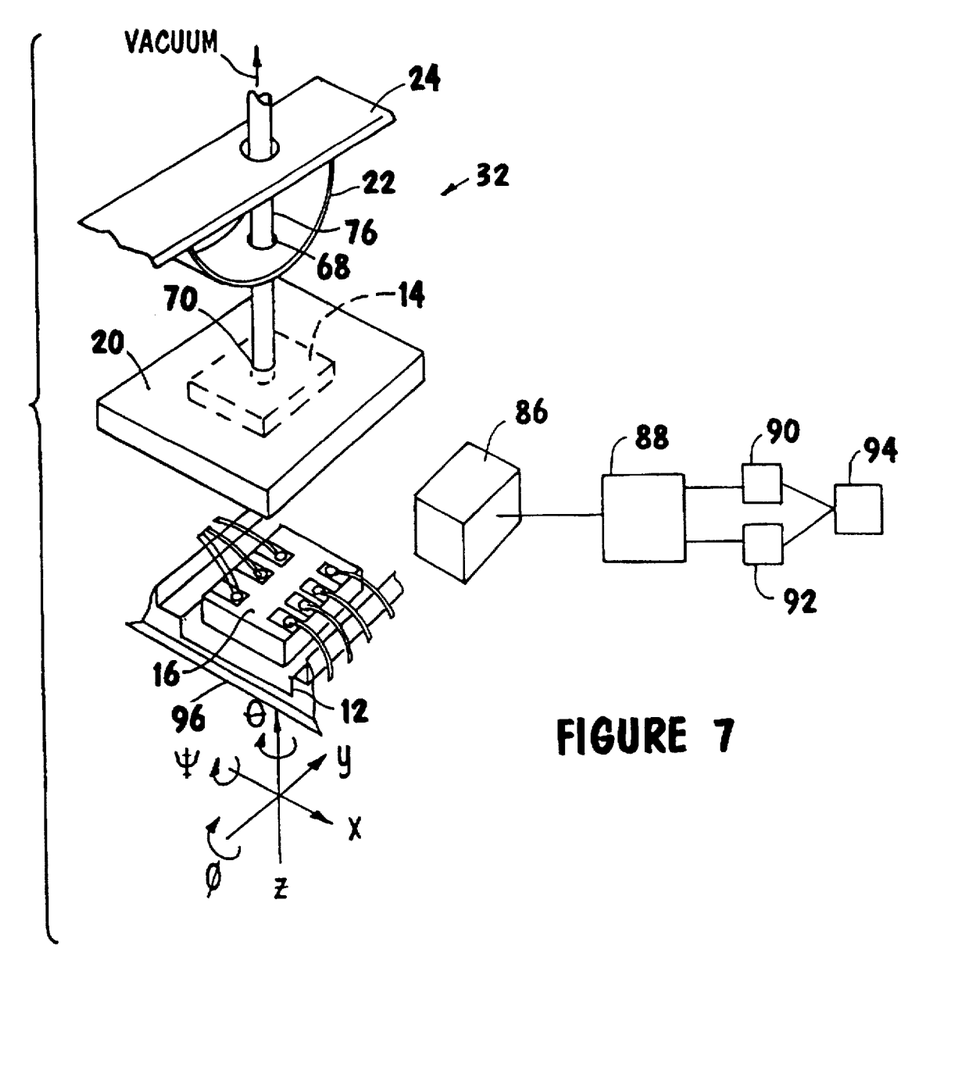
FIG. 7 is a schematic view of an alignment procedure wherein a die is placed into alignment with the interconnect using an assembly tool constructed in accordance with the invention.

During an assembly sequence, the interconnect 16 is wire bonded to the package base 12 and the base 12 is placed on the adjustable support 96 (FIG. 7). Next, the assembly tool 32 aligns the die 14 with the interconnect 16, and places the die 14 into contact with the interconnect 16. With the die 14 in contact with the interconnect 16, the assembly tool 32 then moves to attach the bridge clamp 24 to the package base 12. During the assembly sequence, the slide holder 78 allows the bridge clamp 24 to slide in either direction along a plane parallel to the plane of the support 96 and package base 12. This free sliding movement permits alignment of the die 14 and the interconnect 16 to be maintained even if the bridge clamp 24 and the openings 28, 30 on the package base 12 are misaligned.

For disassembling the package 10, the assembly tool 32 is adapted to detach the bridge clamp 24 from the package base 12, and to remove the die 14 from the interconnect 16. During the disassembly sequence, the bridge clamp 24 can again freely slide to self center itself with respect to the package base 12.

The vacuum conduit 76 of the assembly tool 32 is a hollow tube that is connected to a vacuum source. The open end of the vacuum conduit 76 can attach to the pressure plate 20 and also to the die 14 via a vacuum opening 70 in the pressure plate 20. During the assembly and disassembly sequences, the vacuum conduit 76 is adapted to fit through oversized openings 66, 68 (FIG. 4) formed in the bridge clamp 24 and in the spring 22 respectively.

Still referring to FIGS. 6A and 6B, the slide holder 78 is slidably mounted to the base member 74 of the assembly tool 32. The base member 74 and slide holder 78 can include ball bearings 84 or other components that permit free sliding movement of the slide holder 78 in two directions. During assembly and disassembly of the package 10, this sliding movement permits the alignment of the die 14 and interconnect 16 to be maintained even if the bridge clamp 24 and openings 28, 30 in the package base 12 are not perfectly aligned. In FIG. 6B, the sliding movement in one direction is indicated by directional arrow 98.

For attaching the bridge clamp 24 to the package base 12, the slide holder 78 includes a pair of compression arms 80, 82. As shown in FIG. 6A, the compression arms 80, 82 are adapted to compress the opposite sides of the bridge clamp 24 for inserting (or removing) the mounting tabs 34, 36 of the bridge clamp 24 from the openings 28, 30 in the package base 12. As shown in FIG. 6B, the compression arms 80, 82 can also move outward to allow the opposite sides of the bridge clamp 24 to flex outward and tension the bridge clamp 24 on the package base 12. The slide holder 78 includes a linkage mechanism (not shown) that permits the compression arms 80, 82 to move inward or outward in opposite directions by an equal distance. The linkage mechanism is actuated by an air cylinder (not shown) or other actuator.

FIG. 7 illustrates an alignment procedure for aligning the die 14 held by the vacuum conduit 76 to the interconnect 16 mounted in the package base 12. During the alignment procedure the raised contact members 40 (FIG. 5A) on the interconnect 16 are aligned with the bond pads 54 (FIG. 5A) on the die 14. Alignment of these elements can be accomplished using an alignment process similar to one used for flip chip bonding. Such an alignment process is described in U.S. Pat. No. 5,483,174, incorporated herein by reference. In addition, an automated alignment apparatus is described in U.S. patent application Ser. No. 08/338,345 filed Nov. 14, 1994, incorporated herein by reference.

As shown in FIG. 7, during the alignment procedure, the die 14 and pressure plate 20 are held by the vacuum conduit 76. The vacuum conduit 76 is movable along the z-axis in either direction. An optical probe 86 of the assembly tool 32 is movable between different locations to explore aligned portions of the die 14 and interconnect 16. The optical probe 86 is in light communication with optics 88 and video cameras 90, 92 for providing video images of the opposing surfaces. These images are displayed on a display monitor Still referring to FIG. 7, during the alignment procedure, the package base 12 is supported by the adjustable support 96 of the assembly apparatus 32. The adjustable support 96 and the vacuum conduit 76 are movable along x, y and z axis, in a rotational direction $\Theta$ (theta) and in angles of inclination $\phi$ and $\Psi$. By moving the adjustable support 96 and the vacuum conduit 76 as required, the bond pads 54 (FIG. 5A) on the die 14 can be aligned with the contact members 40 (FIG. 5A) on the interconnect 16. In addition, by using reference marks, adjustment of angles of inclination $\phi$ and $\Psi$ can be used to achieve parallelism of the surfaces of the die 14 and interconnect 16.

Following alignment of the die 14 and interconnect 16, the vacuum conduit 76 is adapted to move the die 14 and pressure plate 20 along the z axis towards the interconnect 16 to place the contact members 40 (FIG. 5A) of the interconnect 16 into contact with the bond pads 54 (FIG. 5A) on the die 14. The vacuum conduit 76 is also adapted to exert a contact force of a predetermined magnitude on the pressure plate 20 and die 14 so that the contact members 40 (FIG. 5A) on the interconnect 16 penetrate the bond pads 54 (FIG. 5A) on the die 14 to a self limiting penetration depth.

Once the die 14 is placed in contact with the interconnect 16, the bridge clamp 24 is attached to the package base 12 by the assembly tool 32. As shown in FIG. 6A, during the attachment process the compression arms 80, 82 of the slide holder 78 clamp onto the bridge clamp 24. When the die 14 and interconnect 16 have been placed into contact, the slide holder 78 of the assembly tool 32 can be moved in a z-direction to place the bridge clamp 24 in the openings 28, 30 of the package base 12. As shown in FIG. 6B, the bridge clamp 24 is allowed to self center with respect to the openings by the sliding motion 98 of the slide holder 78. This allows the die 14 and interconnect 16 to stay in alignment and prevents a shear load from developing between the die 14 and interconnect 16. With the bridge clamp 24 attached to the package base 12, the compression arms 80, 82 are actuated to release the bridge clamp 24 and permit the spring 22 to bias the die 14 and interconnect 16 together.

A reverse sequence can be used to disassemble the package 10. Specifically, the vacuum conduit 76 can contact the die 14 and pressure plate 20. The compression arms 80, 82 can then be actuated to compress the bridge clamp 24 for removal from the openings 28, 30. The slide mounting of the slide holder 78 prevents shear loads from developing between the die 14 and interconnect 16 as the bridge clamp 24 is compressed by the compression arms 80, 82. The vacuum conduit 76 and slide holder 78 are then moved in a z-direction to separate the die 14 and the bridge clamp 24 from the package base 12. With the bridge clamp 24 in place, the spring 22 bears against the pressure plate 20 and biases the die 14 and interconnect 16 together.

While the invention has been described with reference to certain preferred embodiments, as will be apparent to those skilled in the art, certain changes and modifications can be made without departing from the scope of the invention as defined by the following claims.

What is claimed is:

1. A method for assembling a semiconductor package, comprising:

providing a semiconductor die;

providing a base for holding the die, an interconnect on the base for establishing electrical communication with the die, and a force applying mechanism for biasing the die against the interconnect;

aligning the die with the interconnect;

placing the die in electrical contact with the interconnect; and attaching the force applying mechanism to the base while allowing the force applying mechanism to freely move in a plane parallel to the base to compensate for misalignment between the force applying mechanism and the package base.

2. The method as claimed in claim 1 further comprising performing the attaching step with in assembly tool comprising a slidable member for holding the force applying mechanism.

3. The method as claimed in claim 2 wherein the assembly tool comprises a vacuum conduit for holding the die.

4. The method as claimed in claim 1 further comprising detaching the force applying mechanism from the base while allowing the force applying mechanism to slide along the plane.

5. The method as claimed in claim 1 wherein the force applying mechanism comprises a bridge clamp and a spring.

6. The method as claimed in claim 1 wherein the base comprises at least one opening for attaching the force applying mechanism.

7. A method for assembling a semiconductor package, comprising:

providing a semiconductor die;

providing a base for holding the die, an interconnect mounted to the base for establishing electrical communication with the die, and a force applying mechanism attachable to the base for biasing the die against the interconnect;

providing an assembly tool for placing the die in contact with the interconnect and for attaching the force applying mechanism to the base, said assembly tool configured to allow free movement of the force applying mechanism relative to the base to compensate for misalignment therebetween;

aligning the die with the interconnect using the assembly tool;

placing the die in electrical contact with the interconnect using the assembly tool; and attaching the force applying mechanism to the base using the assembly tool.

8. The method as claimed in claim 7 wherein aligning the die and interconnect is performed with an optical alignment device for controlling the assembly tool.

9. The method as claimed in claim 7 further comprising testing the die using the semiconductor package following the attaching step.

10. The method as claimed in claim 7 wherein the force applying mechanism comprises a bridge clamp attachable to the base and a spring mounted to the bridge clamp.

11. The method as claimed in claim 7 wherein the base includes at least one opening for attaching the bridge clamp to the base.

12. The method as claimed in claim 7 wherein the assembly tool comprises a vacuum conduit for holding the die.

13. The method as claimed in claim 7 further comprising detaching the force distribution mechanism from the base and separating the die from the interconnect using the assembly tool.

14. A method for assembling a semiconductor package comprising:

providing a semiconductor die;

providing a base for holding the die, said base comprising at least one opening;

providing an interconnect on the base for establishing electrical communication with the die;

providing a clamp attachable to the opening and a spring attached to the clamp, said clamp and spring configured to bias the die against the interconnect;

providing an assembly tool configured to place the die on the interconnect and to attach the clamp to the base, said assembly tool comprising a support member for supporting the base, a sliding member for handling the clamp, and a vacuum conduit for handling the die, said sliding member configured for free sliding movement along a plane parallel to the support member;

placing the base on the support member;

placing the die in contact with the interconnect using the vacuum conduit; and attaching the bridge clamp to the opening using the support member while allowing the clamp to self center to the opening.

15. The method as claimed in claim 14 wherein the sliding member comprises a pair of arms for compressing and releasing the bridge clamp.

16. The method as claimed in claim 14 further comprising aligning the die with the interconnect during the placing step.

17. The method as claimed in claim 14 further comprising testing the die using the package.

18. The method as claimed in claim 14 further comprising placing the package in a burn-in oven following the attaching step.

19. The method as claimed in claim 14 wherein the spring contacts a pressure plate that contacts the die.

20. The method as claimed in claim 14 further comprising detaching the bridge clamp from the base using the assembly tool.

21. A method for assembling a semiconductor package, comprising:

providing a semiconductor die;

providing a base for holding the die, an interconnect on the base for establishing electrical communication with the die, and a force applying mechanism for biasing the die against the interconnect;

providing an assembly tool configured to place the die in contact with the interconnect, and to attach the force applying mechanism to the base, while allowing free movement of the force applying mechanism relative to the base to compensate for misalignment therebetween without effecting an alignment of the die with the interconnect;

placing the die in electrical contact with the interconnect using the assembly tool; and attaching the force applying mechanism to the base using the assembly tool.

22. The method as claimed in claim 21 further comprising testing the die following the attaching step.

23. The method as claimed in claim 22 further comprising following the testing step detaching the force applying mechanism from the base and the die from the interconnect using the assembly tool.

24. A method for assembling a semiconductor package, comprising:

providing a semiconductor die;

providing a base for holding the die, an interconnect on the base for establishing electrical communication with the die, and a force applying mechanism for biasing the die against the interconnect;

aligning the die with the interconnect;

placing the die in contact with the interconnect;

attaching the force applying mechanism to the base to bias the die against the interconnect;

said placing and attaching steps performed by allowing the force applying mechanism to freely move with respect to the base to compensate for misalignment between the force applying mechanism and base while allowing the die and interconnect to remain aligned.

25. The method as claimed in claim 24 further comprising testing the die following the attaching step.

26. The method as claimed in claim 25 further comprising following the testing step detaching the force applying mechanism from the base and the die from the interconnect while allowing the force applying mechanism to freely move with respect to the base.

* * * * *